(12) United States Patent
Lee et al.

(10) Patent No.: US 8,811,029 B2
(45) Date of Patent: Aug. 19, 2014

(54) INTEGRATED CIRCUIT BOARD AND DISPLAY SYSTEM

(75) Inventors: Keng-Yi Lee, Hsin-Chu (TW); Shih-Yao Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 321 days.

(21) Appl. No.: 13/326,332

(22) Filed: Dec. 15, 2011

(65) Prior Publication Data

US 2013/0083497 A1   Apr. 4, 2013

(30) Foreign Application Priority Data

Oct. 4, 2011  (TW) .............................. 100135976 A

(51) Int. Cl.
*H05K 7/00* (2006.01)
*H05K 1/16* (2006.01)
*H05K 1/02* (2006.01)
*H05K 1/14* (2006.01)

(52) U.S. Cl.
CPC ........ *H05K 1/16* (2013.01); *H05K 2201/09972* (2013.01); *H05K 1/147* (2013.01); *H05K 1/0243* (2013.01)
USPC ...................... 361/777; 455/575.5; 455/550.1

(58) Field of Classification Search
USPC ............................ 361/777; 455/575.5, 550.1
See application file for complete search history.

(56) References Cited

U.S. PATENT DOCUMENTS

| | | | |
|---|---|---|---|
| 2011/0014881 A1* | 1/2011 | Yang | 455/90.3 |
| 2011/0157313 A1* | 6/2011 | Chiang | 348/46 |
| 2012/0299784 A1* | 11/2012 | Ayatollahi | 343/702 |

FOREIGN PATENT DOCUMENTS

| | | |
|---|---|---|
| CN | 201035451 Y | 3/2008 |
| CN | 101924270 A | 12/2010 |
| TW | 200700804 | 1/2007 |
| TW | M389278 | 9/2010 |
| TW | 201105050 | 2/2011 |

\* cited by examiner

*Primary Examiner* — Andargie M Aychillhum
(74) *Attorney, Agent, or Firm* — Winston Hsu; Scott Margo

(57) ABSTRACT

An integrated circuit board includes a substrate, a plurality of electronic components and at least one antenna. The substrate has a central area and two edge areas, wherein the central area is between the two edge areas. The electronic components are disposed on the central area. The antenna is disposed on at least one of the two edge areas, wherein there is predetermined distance between the antenna and the electronic components.

11 Claims, 4 Drawing Sheets

INTEGRATED CIRCUIT BOARD AND DISPLAY SYSTEM

BACKGROUND OF THE INVENTION

1. Field of the Invention

The present invention relates to an integrated circuit board and a related display system, and more specifically, to an integrated circuit board with an antenna integrated thereon and a related display system.

2. Description of the Prior Art

Please refer to FIG. 1, which is a diagram of a display system 1 according to the prior art. As shown in FIG. 1, the display system 1 includes a display panel 10, a camera module 12, two antennas 14, and a circuit board 16 for the display panel 10. In general, the camera module 12, the antennas 14, and the circuit board 16 are disposed around the display panel 10, and are electrically connected to a main board of a host device (e.g. a notebook) via signal transmitting cables 120, 140, 160, respectively. The display panel 10 is electrically connected to the circuit board 16 via a flexible circuit board 100. Since there is some space needed to save in advance around the display panel 10 for containing the camera module 12 and the antenna 14, it is disadvantageous to the thinning tendency of the display system 1.

SUMMARY OF THE INVENTION

The present invention provides an integrated circuit board. The integrated circuit board includes a substrate, a plurality of electronic components, and at least one antenna. The substrate has a central area and two edge areas. The central area is between the two edge areas. The plurality of electronic components is disposed on the central area. The antenna is disposed on at least one of the two edge areas. There is a predetermined distance between the antenna and the electronic components.

The present invention further provides a display system. The display system includes a display panel and an integrated circuit board disposed at a side of the display panel and electrically connected to the display panel. The integrated circuit board includes a substrate, a plurality of electronic components, and at least one antenna. The substrate has a central area and two edge areas. The central area is between the two edge areas. The plurality of electronic components is disposed on the central area. The antenna is disposed on at least one of the two edge areas. There is a predetermined distance between the antenna and the electronic components.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
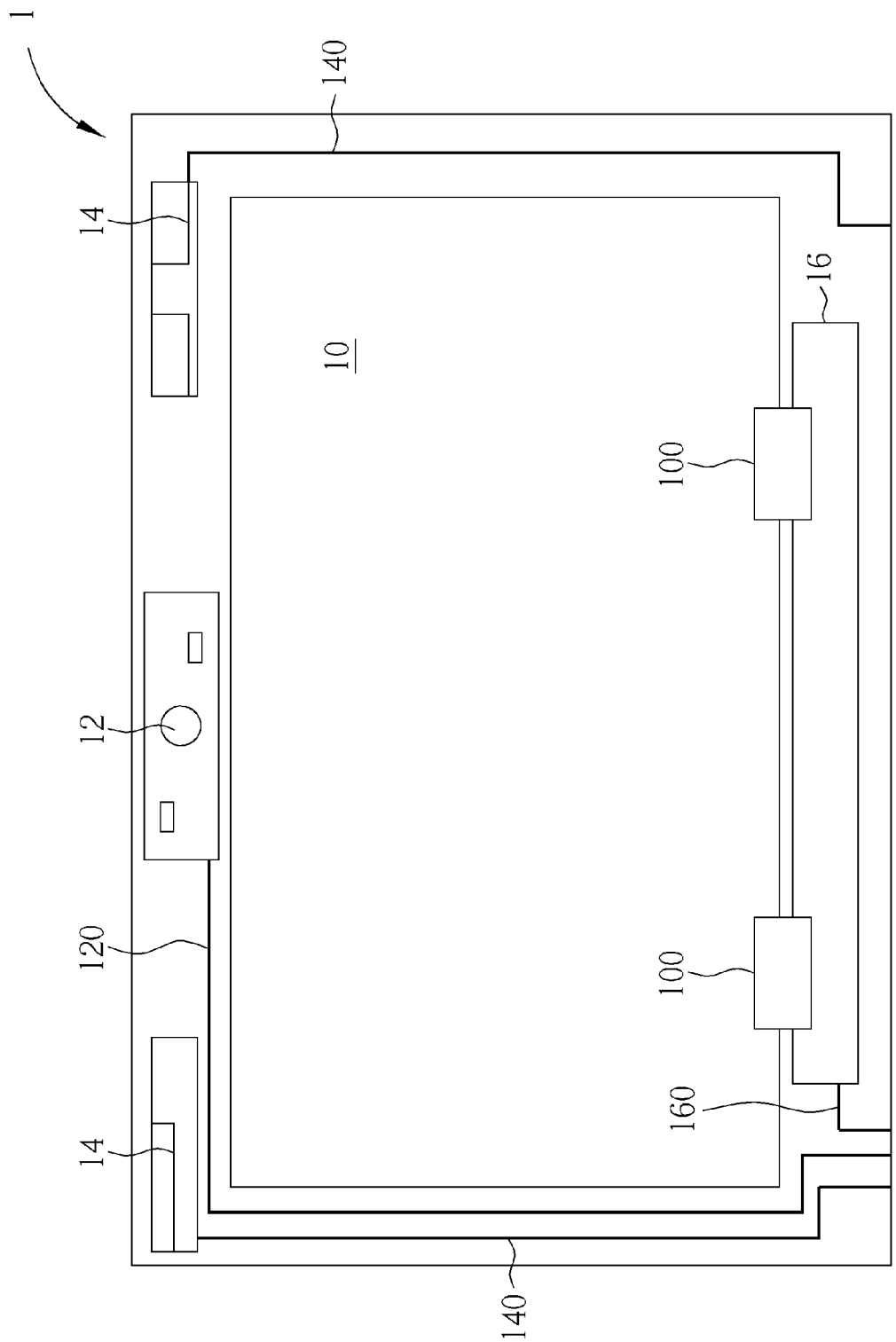
FIG. 1 is a diagram of a display system according to the prior art.
Figure 2:
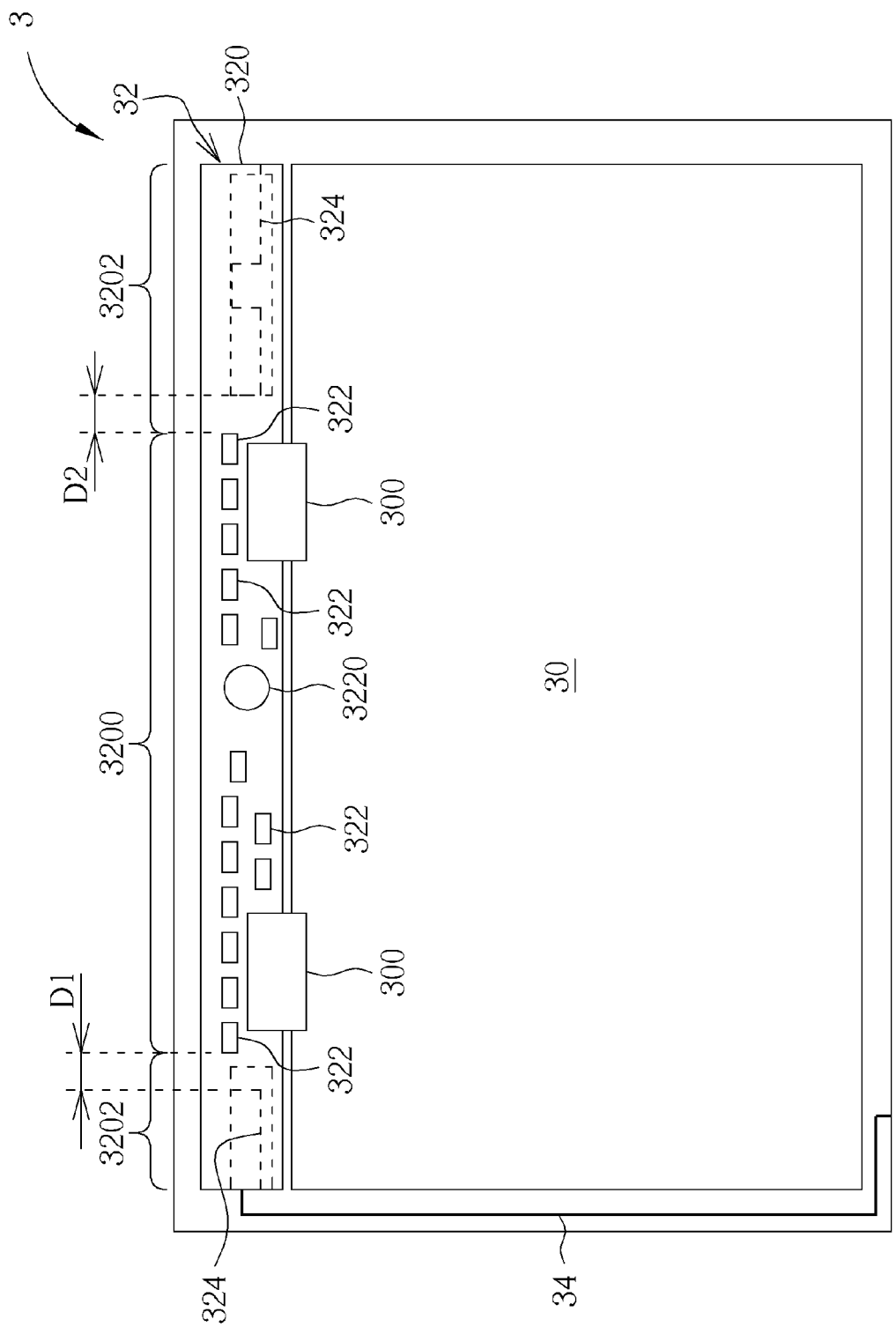
FIG. 2 is a diagram of a display system according to an embodiment of the present invention.

Please refer to FIG. 2, which is a diagram of a display system 3 according to an embodiment of the present invention. As shown in FIG. 2, the display system 3 includes a display panel 30 and an integrated circuit board 32. The integrated circuit board 32 is disposed at a side of the display panel 30 and is electrically connected to the display panel 30 via a flexible circuit board 300. In practical application, the display panel 30 can be a liquid crystal display panel, but is not limited thereto. The integrated circuit board 32 includes a substrate 320, a plurality of electronic components 322, and at least one antenna 324. In this embodiment, the integrated circuit board 32 includes two antennas 324 (but not limited thereto). In other words, number of the antenna integrated on the integrated circuit board 32 depends on the practical application of the display system 3.

The substrate 320 has a central area 3200 and two edge areas 3202, wherein the central area 3200 is between the two edge areas 3202. The electronic components 322 are disposed on the central area 3200. The two antennas 324 are disposed on the two edge areas 3202 respectively, and are at predetermined distances D1, D2 from the electronic components 322 respectively for preventing signal transmission of the antennas 324 from being interfered by the electronic components 322. The predetermined distance D1 can be equal to or different from the predetermined distance D2. In this embodiment, the predetermined distances D1, D2 is greater than or equal to 1 cm, but is not limited thereto. Furthermore, on the premise that the signal transmission of the antennas 324 is not interfered, the predetermined distances D1, D2 can be reduced to several millimeters. In this embodiment, an antenna printing process (but not limited thereto) can be utilized to dispose the antenna 324 on the edge area 3202 of the substrate 320.

In this embodiment, the electronic components 322 can include an image capturing module 3220 (e.g. a camera module). In other words, the present invention can integrate the image capturing module 3220 into the integrated circuit board 32. Furthermore, signals generated by the display panel 30, the electronic components 322 (including the image capturing module 3220) and the antennas 324 can be outputted via a single signal transmitting path 34 so that number of the signal transmitting cable needed in the display system 3 can be reduced accordingly. In this embodiment, the single signal transmitting path 34 can be a flexible circuit board or a cable.

As shown in FIG. 2, since the antennas 324 are integrated into the substrate 320, there is no need to save space in advance around the display panel 30 for containing the antennas 324. Accordingly, the width of the side frame of the display system 3 can be reduced efficiently, so as to achieve the purpose of narrowing the side frame of the display system 3. Furthermore, since the present invention also integrates the image capturing module 3220 into the substrate 320, the width of the side frame of the display system 3 can be further reduced.

Figure 3:
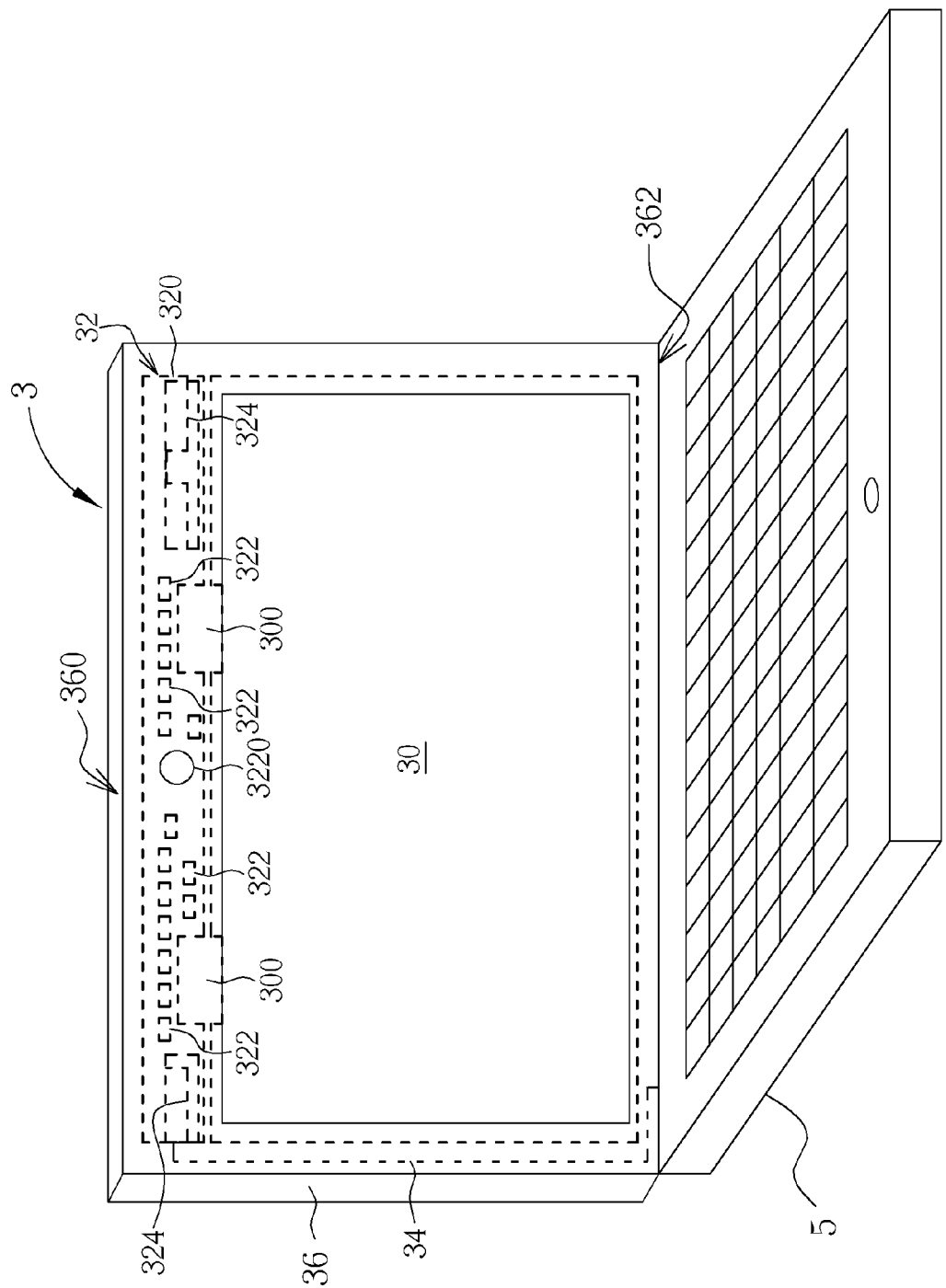
FIG. 3 is a diagram of the display system of the present invention being connected to a base.

Please refer to FIG. 3, which is a diagram of the display system 3 of the present invention being connected to a base 5. As shown in FIG. 3, the display system 3 can be connected to the base 5 to form a notebook. The display system 3 further includes a frame 36, and the display panel 30 and the integrated circuit board 32 are disposed in the frame 36. The frame 36 has a first side 360 and a second side 362. The second side 362 is connected to the base 5 and is opposite to the first side 360. As shown in FIG. 3, the integrated circuit board 32 is disposed at the first side 360 of the frame 36, and signals generated by the display panel 30, the electronic components 322 (including the image capturing module 3220) and the antennas 324 can be outputted to a main board (not shown in figures) of the base 5 via the single signal transmitting path 34 for reducing number of the signal transmitting cable needed in the display system 3. Accordingly, the width of the side frame of the display system 3 can be reduced efficiently.

Figure 4:
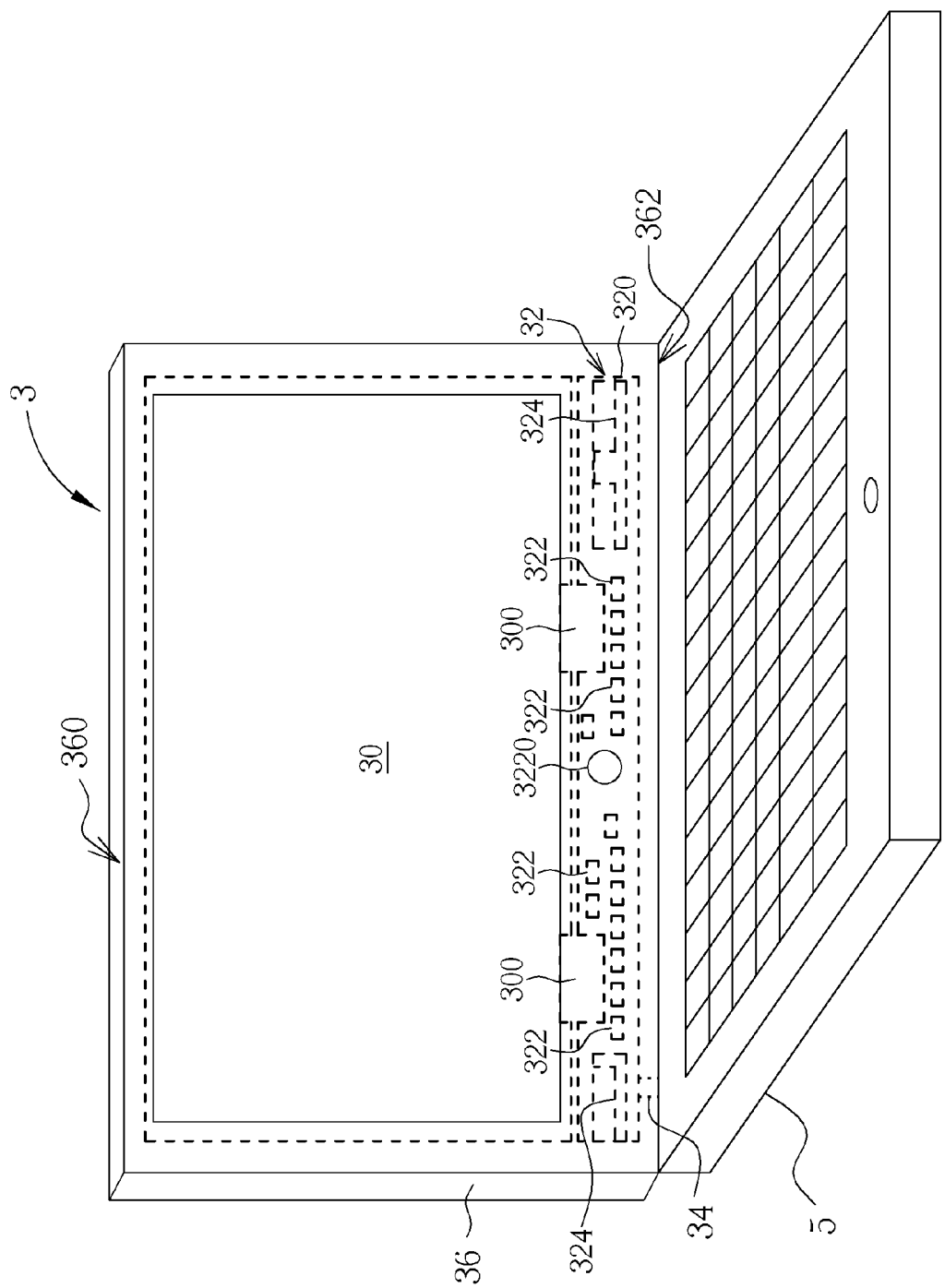
FIG. 4 is another diagram of the display system of the present invention being connected to the base.

Please refer to FIG. 4, which is another diagram of the display system 3 of the present invention being connected to the base 5. As shown in FIG. 4, the integrated circuit board 32 is disposed at the second side 362 of the frame 36, and signals generated by the display panel 30, the electronic components 322 (including the image capturing module 3220) and the antennas 324 can be outputted to a main board (not shown in figures) of the base 5 via the single signal transmitting path 34 for reducing number of the signal transmitting cable needed in the display system 3. Accordingly, the width of the side frame of the display system 3 can be reduced efficiently. Furthermore, since the integrated circuit board 32, the electronic components 322 (including the image capturing module 3220) and the antennas 324 are disposed at the second side 362 of the frame 36 (i.e. under the display panel 30), the single signal transmitting path 34 can transmit the signals generated by the display panel 30, the electronic components 322 (including the image capturing module 3220) and the antennas 324 to a main board of the base 5 without passing through the side frame of the display system 3. In such a manner, either the width of the side frame of the display system 3 or the length of the single signal transmitting path 34 can be further reduced, so that the display system 3 can have less signal loss.

To be noted, for preventing the signal transmission of the antennas 324 from being interfered by other signals, the signal transmitting path of the antennas 324 can be independent from the signal transmitting path of the display panel 30 and the electronic components 322 (including the image capturing module 3220).

Compared with the prior art, since the present invention integrates the antenna into the circuit board, there is no need to save space in advance around the display panel for containing the antenna. Accordingly, the width of the side frame of the display system can be reduced efficiently, so as to achieve the purpose of narrowing the side frame of the display system. Furthermore, the present invention also integrates the image capturing module into the circuit board so that the width of the side frame of the display system can be further reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit board disposed at a side of a display panel and electrically connected to the display panel, the integrated circuit board comprising:
   a substrate having a central area and two edge areas, the central area being between the two edge areas;
   an image capturing module disposed on the central area; and
   at least one antenna disposed on at least one of the two edge areas, wherein there is a predetermined distance between the antenna and the image capturing module.

2. The integrated circuit board of claim 1, wherein the predetermined distance is greater than or equal to 1 cm.

3. The integrated circuit board of claim 1, wherein signals generated by the image capturing module and the antenna are outputted via a single signal transmitting path.

4. The integrated circuit board of claim 3, wherein the single signal transmitting path is a flexible circuit board or a cable.

5. A display system comprising:
   a display panel; and
   an integrated circuit board disposed at a side of the display panel and electrically connected to the display panel, the integrated circuit board comprising:
   a substrate having a central area and two edge areas, the central area being between the two edge areas;
   an image capturing module disposed on the central area; and
   at least one antenna disposed on at least one of the two edge areas, wherein there is a predetermined distance between the antenna and the image capturing module.

6. The display system of claim 5, wherein the predetermined distance is greater than or equal to 1 cm.

7. The display system of claim 5, wherein signals generated by the image capturing module and the antenna are outputted via a single signal transmitting path.

8. The display system of claim 7, wherein the single signal transmitting path is a flexible circuit board or a cable.

9. The display system of claim 5, further comprising:
   a frame having a first side and a second side, the first side being connected to a base, the second side being opposite to the first side, the display panel and the integrated circuit board being disposed in the frame.

10. The display system of claim 9, wherein the integrated circuit board is disposed at the first side.

11. The display system of claim 9, wherein the integrated circuit board is disposed at the second side.

* * * * *